(12) United States Patent
Hannah

(10) Patent No.: US 7,892,719 B2
(45) Date of Patent: Feb. 22, 2011

(54) PHOTONIC CRYSTAL EUV PHOTORESISTS

(75) Inventor: Eric C. Hannah, Pebble Beach, CA (US)

(73) Assignee: Intel Corporation, Santa Clara, CA (US)

( * ) Notice: Subject to any disclaimer, the term of this patent is extended or adjusted under 35 U.S.C. 154(b) by 963 days.

(21) Appl. No.: 11/592,623

(22) Filed: Nov. 3, 2006

(65) Prior Publication Data

US 2008/0107994 A1    May 8, 2008

(51) Int. Cl.
| | |
|---|---|
| G03C 1/795 | (2006.01) |
| G03F 7/09 | (2006.01) |
| G03F 7/20 | (2006.01) |
| G03F 7/30 | (2006.01) |

(52) U.S. Cl. ............. 430/270.1; 430/271.1; 430/273.1; 430/325; 430/326; 430/329; 430/921; 430/925

(58) Field of Classification Search ...................... None
See application file for complete search history.

(56) References Cited

U.S. PATENT DOCUMENTS

| | | | |
|---|---|---|---|
| 6,194,157 B1 * | 2/2001 | Tsuchiya et al. ............... | 435/6 |
| 2004/0020423 A1 | 2/2004 | Lewis, III et al. | |
| 2004/0115696 A1 | 6/2004 | Heller | |
| 2004/0134414 A1 | 7/2004 | Lewis, III et al. | |
| 2006/0216740 A1 | 9/2006 | Edman et al. | |

FOREIGN PATENT DOCUMENTS

WO    2008/055110 A3    5/2008

OTHER PUBLICATIONS

International Preliminary Report on Patentability for Patent Application No. PCT/US2007/082863, mailed May 14, 2009, 8 pages.
International Search Report/Written Opinion for Patent Application No. PCT/US2007/082863, mailed Jun. 13, 2008, 14 Pages.
Sauer, Petra et al., "Design Tools For the Fabrication of a Photonic Crystal Based on DNA Junctions", IEEE, pp. 428-431 (2003).
Sauer, Petra et al., "Design of Photonic Crystals Fabricated From DNA Lattices", IEEExplore, pp. 44-45 (2003).
Hillebrand, Reinald et al., "Woodpiles for Photons", Science, vol. 305, dated Jul. 9, 2004, pp. 187-188.
Mathieu, F. et al., "A DNA Nanotube Based on a Six-Helix Bundle Motif", Albany 2001, JBSD Online, dated Jun. 19-23, 2001, 2 Pages.
Seeman, Nadrian C. "DNA Nicks and Nodes and Nanotechnology", Nano Letters, vol. 1, No. 1, dated Nov. 28, 2000, pp. 22-26.
Winfree, Erik et al., "Design and self-assembly of two-dimensional DNA crystals", Nature, vol. 394, dated Aug. 6, 1998, pp. 539-544.

* cited by examiner

Primary Examiner—Sin J. Lee
(74) Attorney, Agent, or Firm—Julia A. Hodge

(57) ABSTRACT

Embodiments of the present invention provide EUV (extreme ultraviolet) photoresists comprising photonic crystals, as well as other components. Photonic crystals in general provide the ability not only to block light transmission, but also to create resonant pockets in which light can propagate. The photonic crystals are based on bio-related polymers that are capable of self-assembly into crystalline form.

14 Claims, 7 Drawing Sheets

A

B

PHOTONIC CRYSTAL EUV PHOTORESISTS

BACKGROUND OF THE INVENTION

1. Field of the Invention

Embodiments of the present invention relate generally to semiconductor lithography, photonic crystals, and photoresist compositions.

2. Background Information

Photoresists used for Extreme Ultraviolet (EUV) lithography are generally an extension of systems used for UV lithography or even e-beam resists. Typically, the wavelengths considered Extreme Ultraviolet are between 10 nm and 15 nm, or 0.01 μm to 0.015 μm. The body of the resist typically consists of a polymer that is cross-linked after thermal processing (baking) so as to create a protective barrier to follow-on processing steps. In newer resists molecular ingredients called Photo Generated Acid groups, PGAs, act as the patterning agent. Under exposure to UV light the PGAs release protons that bind to nearby monomers in the cross-linked polymer. When a developer solution is applied, these newly protonated monomer groups become soluble and leave the polymer matrix. The result is a removal of the protective cross-linked polymer in areas that have been exposed to light, thus producing a positive mask for further processing of the substrate.

There are many parameters of this chemical processing that need to be controlled and optimized. As lithography moves down into the nanometer range of definition the thickness of the photoresist needs to scale as well in order to produce patterns with reasonable vertical to horizontal aspect ratios. This in turn reduces the sensitivity of the system to light exposure as there is less absorption depth. Additionally, the use of a random, cross-linked polymer as the resist material results in line roughness due to the fundamental variations of a cross-linked polymer.

DETAILED DESCRIPTION OF THE INVENTION

Embodiments of the present invention provide methods to create photosensitive layers demonstrating enhanced photosensitivity and better geometrical control of the lines and or areas that are photo exposed in typical photolithographic procedures used in semiconductor manufacturing. A DNA-based or peptide-based self-assembled structure, forming a photonic crystal with an embedded resonant cavity tuned to the dominant wavelength used in EUV lithography, can be used to create a photoactive layer. Photo-sensitive acid groups are used in the internal layer of the cavity structure and contribute protons to the cavity material when exposed to strong EUV light levels. The net result is a thin photoresist that is highly sensitive to EUV radiation, with nanometer roughness along the natural motif cleavage directions.

Deoxyribo Nucleic Acid (DNA) is a polymeric molecule commonly known as the molecule containing the genetic information for life. The DNA polymer is comprised of nucleotide monomers linked together through a phosphodiester bond. In general, the nucleotides comprising a polynucleotide are naturally occurring deoxyribonucleotides, such as adenine, cytosine, guanine or thymine linked to 2'-deoxyribose. The relative associations of the groups that make up a nucleotide and a DNA polymer can be seen in FIG. 1. However, a polynucleotide or oligonucleotide also can contain nucleotide analogs, including non-naturally occurring synthetic nucleotides or modified naturally occurring nucleotides. Shorter polymers of DNA, such as polymers containing less than about 20 nucleotides, are known as oligomers or oligonucleotides. A key feature of DNA is its ability to recognize and associate with other DNA molecules through specific base pairing interactions, a process known as hybridization. The structure formed from two DNA molecules that have associated through specific base pairing interactions is known as double stranded DNA. Hybridization occurs through the recognition of an adenine on one polymeric strand for a thymine of another strand and a guanine for a cytosine on another strand.

Figure 1:
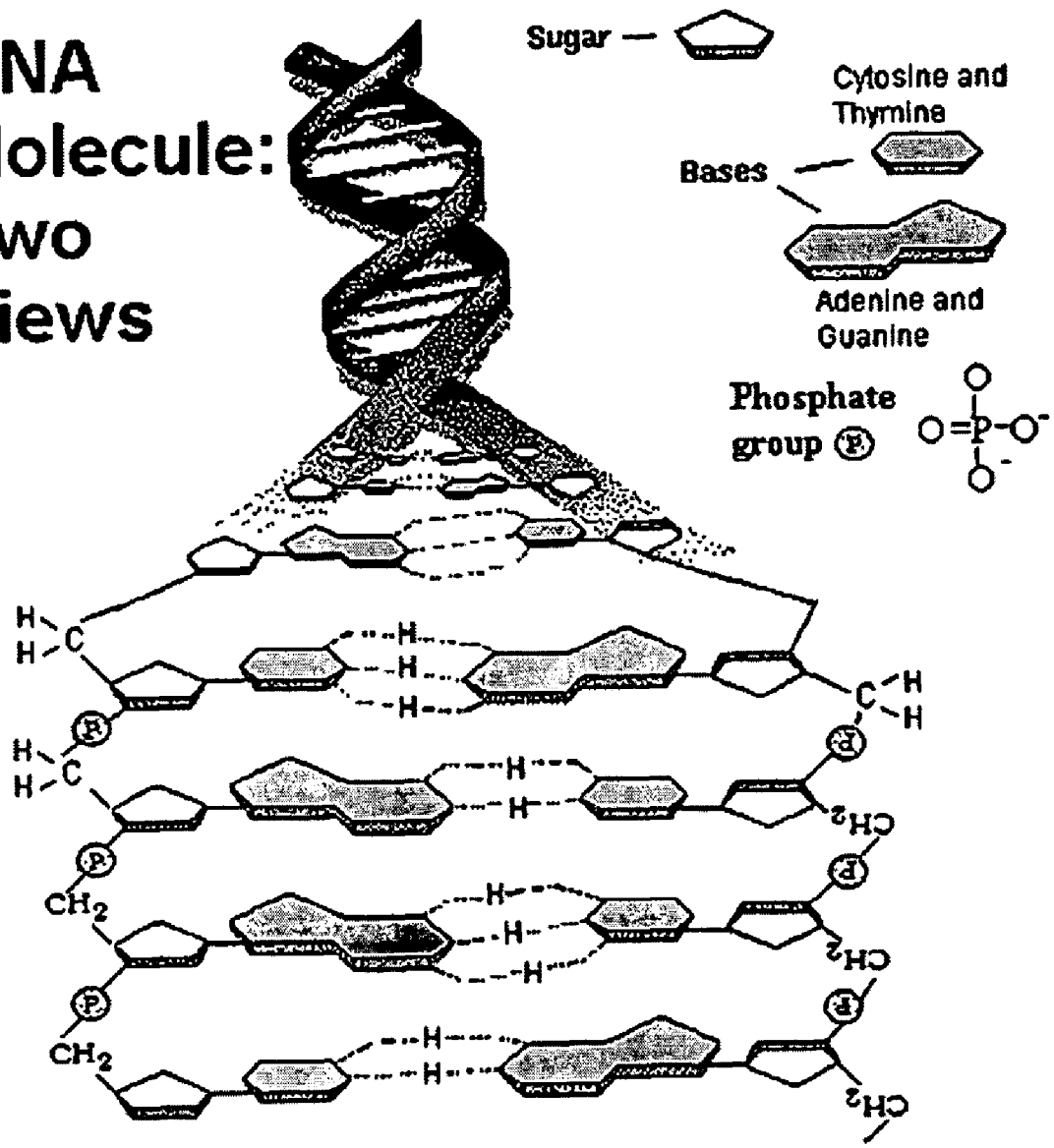
FIG. 1 shows a drawing of a DNA double helix and the monomers that make up the DNA polymer.

Similar to the topography of a spiral staircase, double stranded DNA will wind to form a double helix. A representation of a wound double stranded DNA molecule is shown in FIG. 1. The winding of a DNA molecule in solution typically occurs as a self-assembly process after hybridization of two complementary strands.

The structure of the DNA double helix provides nanoscale dimensions, rigid stable structure, the ability to self-assemble, and controlled molecular interactions. Single stranded oligonucleotides base pair to each other through hydrogen bonding of complementary nucleic acids to form long linear chains. Branched junctions form as recombination intermediates but rapidly resolve into double helices. Branched junctions can be made to be stable through careful control of the nucleic acid sequence. The sequence of each single strand is chosen to maximize Watson-Crick base pairing, minimize unwanted symmetries and eliminate migrations at the junction. Nucleic acid sequences that provide these properties can be generated, for example, by using SEQUIN, a sequence design program, or GIDEON, a program for design and sequence optimization in structural nucleic acid chemistry. See, for example, Seeman, Nadrian, "De Novo Design of Sequences for Nucleic Acid Structural Engineering," *J. of Biom. Str. & Dyn.*, 8, 573 (1990) and Birac, Jeffrey J., and Seeman, Nadrian C., "GIDEON, A Program for Design and Sequence Optomization in Structural Nucleic Acid Technology," *J. of Biom. Str. & Dyn.*, Book of Abstracts: Albany 2003.

Figure 2:
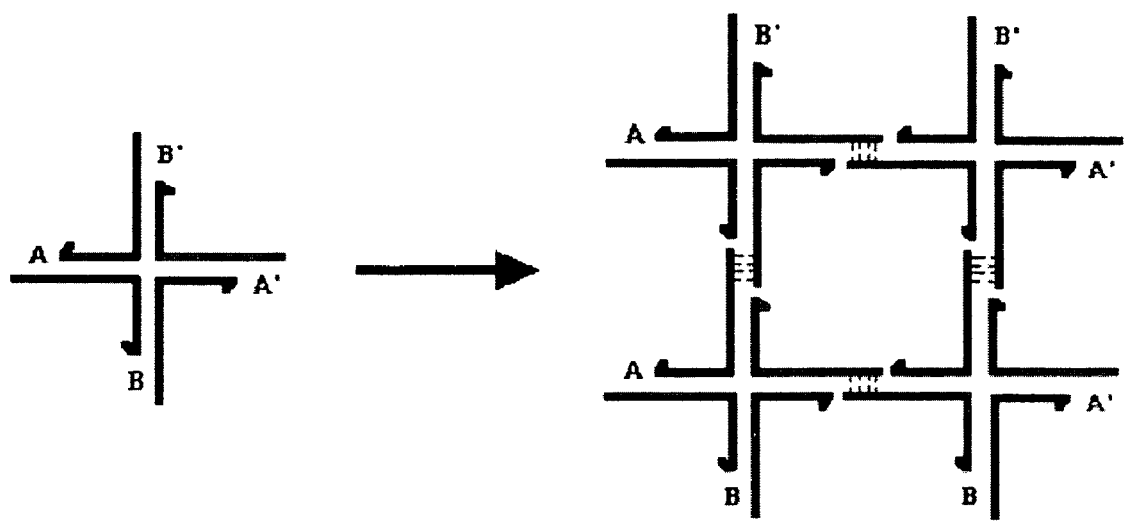
FIG. 2 provides a diagram of DNA branched junctions and sticky-end connectivity.
Figure 3:
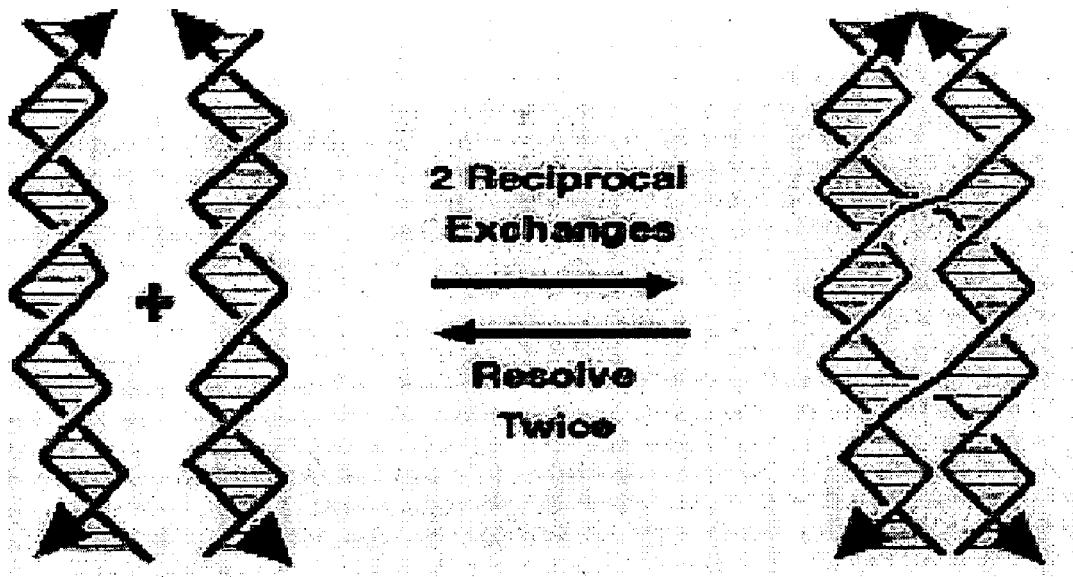
FIGS. 3A and 3B show the fusion of two double-stranded DNA molecules to form a double crossover four-stranded structure.
Figure 3:
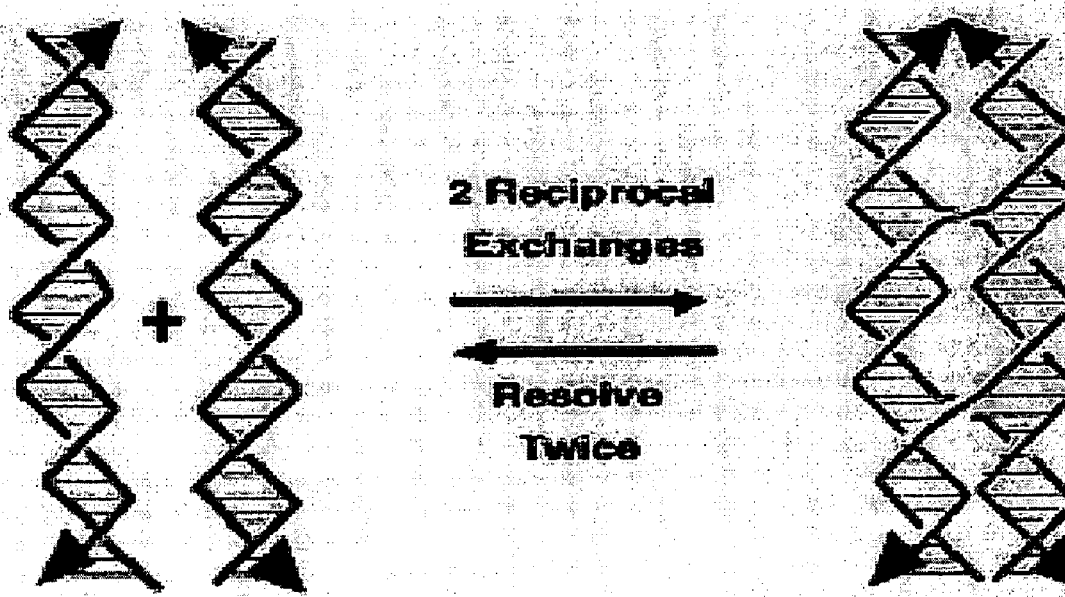

In the case of DNA, once individual stable junctions are designed, they can be annealed together, through either sticky ended complementarity, DX complementarity (double crossover), or PX complementarity (a paranemic crossover DNA structure) to form a periodically repeating pattern. FIG. 2 provides a drawing of DNA branched junctions that have been annealed together through sticky-end complementarity. A sticky end (or a cohesive end) is formed in double-stranded DNA in which one of the strands is longer than the other and creates an overhang (single stranded region) from the portion of the longer DNA strand that extends beyond the complementary region. If another DNA fragment exists with an overhang that is complementary to the first overhang, these two fragments will tend to associate with each other through hybridization between the complementary overhang regions. Strands can then be joined, for example through the use of an enzyme such as a DNA ligase. FIG. 3A illustrates the formation of DX, double crossover DNA structure in which two double stranded DNA molecules have fused into a four stranded structure. FIG. 3B illustrates the formation of a PX structure (paranemic crossover DNA) in which two double stranded DNA molecules have create a structure that contains four DNA strands in which the strands cross over at every possible juxtaposition. See, for example, Seeman, Nadrian C., "DNA Nicks and Nodes and Nanotechnology," *Nano Letters*, 1:1, 22 (2001).

Figure 4:
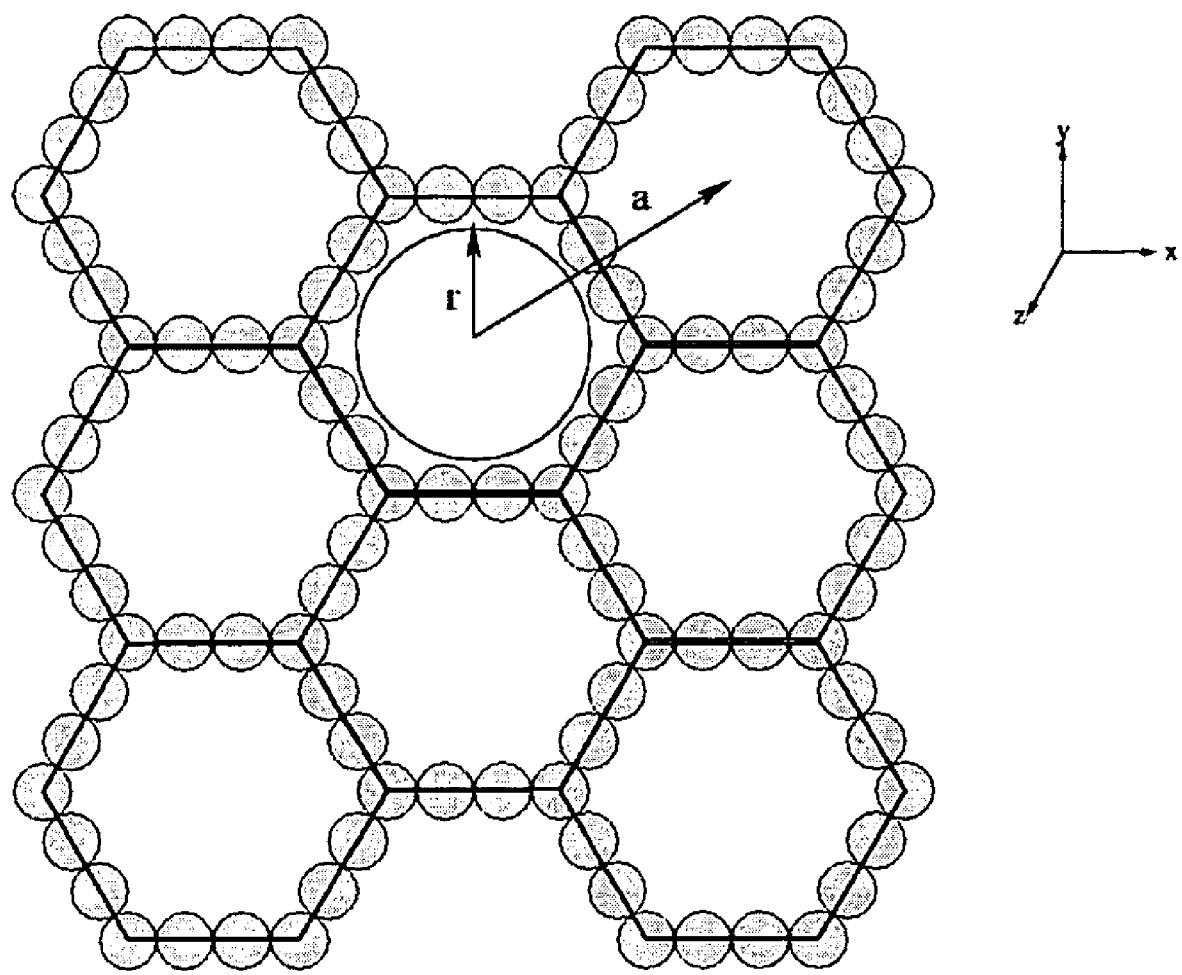
FIG. 4 provides a drawing of a photonic crystal structure created from double stranded helical DNA.

If a structure has a regularly repeating change in dielectric constant, it can be modeled as a photonic crystal. Photonic crystals are created in periodic electromagnetic media having photonic band gaps. A photonic crystal is essentially an optical insulator in the photonic band gap region; in the photonic band gap region no light can propagate. One possibility for achieving this type of lattice out of DNA is to create a crystal containing periodic holes. Referring now to FIG. 4, a single DNA nanotube that consists of six parallel DNA double helices that are joined together to form a hexagon with an approximately cylindrical shaped cavity in the center has been designed and created. See Mathieu, F., Mao, C., Seeman, N., "A DNA Nanotube Based on a Six-Helix Bundle Motif," *J. Biomol. Struct. & Dyn.*, Albany 2001. Each pair of adjacent double helices follows the DX motif. The size of the central cavity can then be controlled by varying the number of helices per hexagon side. By joining parallel nanotubes together, a self-assembling trigonal lattice with a dielectric constant that periodically repeats in two dimensions can be created.

Figure 5:
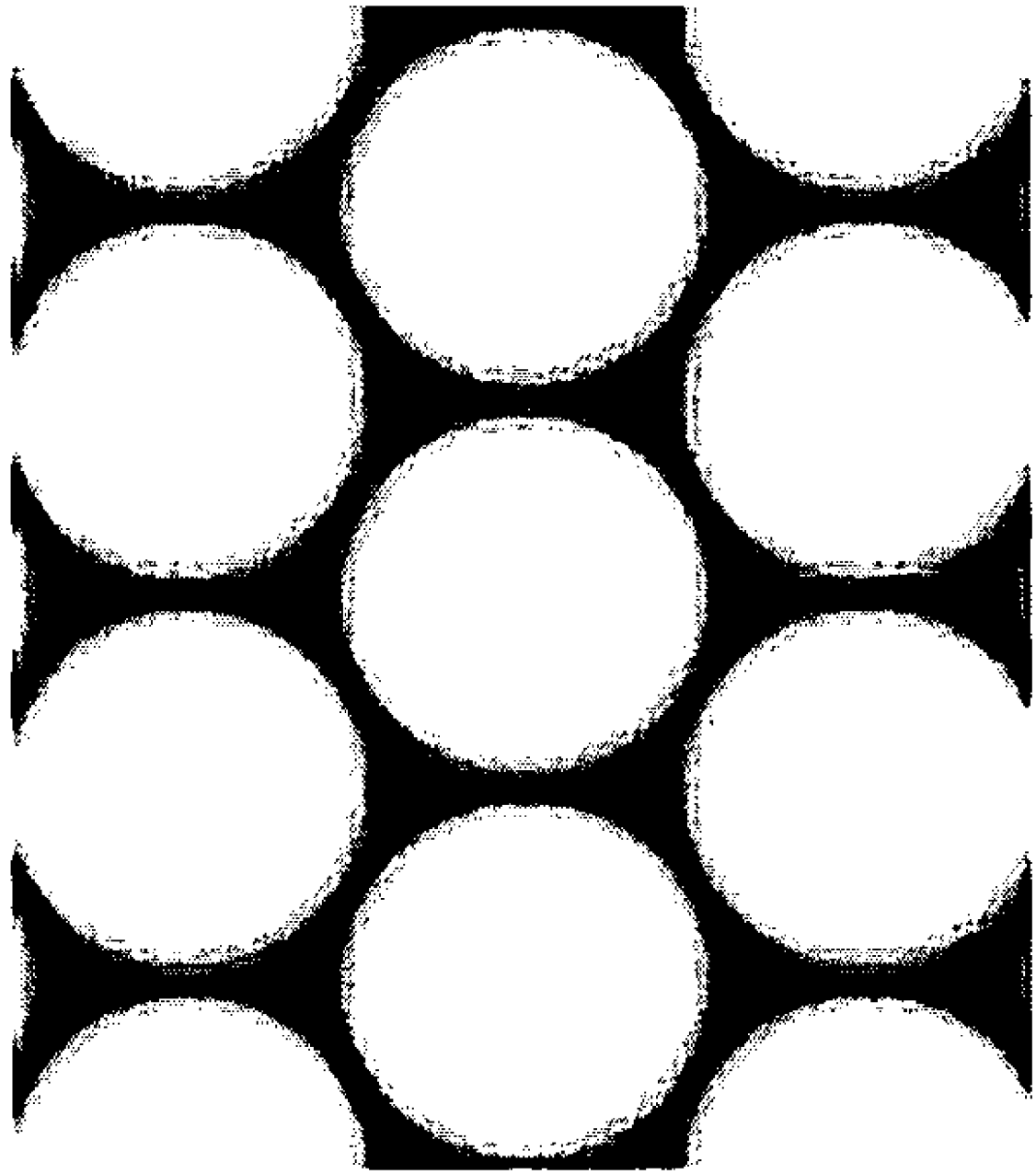
FIG. 5 shows a model that can be used to calculate a band gap for the photonic crystal shown in FIG. 4.

In order to obtain the band structure for this photonic crystal, the lattice is approximated as cylindrical rods of water cut into a material that has the same dielectric constant as DNA ($\epsilon_{DNA}$=16.0). Since a gap is expected to occur in a wavelength region comparable to that of the lattice constant, a dielectric constant of water in the far UV is used ($\epsilon_{H2O}$=2.0). Each hexagon in the lattice contains four helices to a side each having a radius of 1.0 nm, yielding a lattice vector a=6 Sqrt[3] nm and a radius for each cylindrical rod of r=3 Sqrt[3]−1 nm. For these calculations, the length of each helix was taken to be infinite. FIG. 5 shows the approximation of the dielectric function that was used in the numerical calculations of the band structure of the DNA lattice. Photonic band gaps were calculated to be between 8.2 nm and 18.7 nm, through adjusting the number of helices per hexagon side. Sauer, P., Cui, H-L, Seeman, N. C., "Design Tools for the Fabrication of a Photonic Crystal Based on DNA Junctions," Third IEEE Conference on Nanotechnology (2003). The photonic crystal gap can be made in the regions surrounding and between the 10 to 15 nm wavelength useful in EUV lithography by adjusting the number of helices in a motif. The width of the crystal bandgap depends upon the two dielectric constants of the crystal and the open spaces in the crystal lattice.

An alternative to DNA is the synthesis of stereochemically pure cyclic bis-amino acid molecular building blocks that are coupled through pairs of amide bonds to create spiro-linked oligomers of specific constitution. The oligomers are efficiently assembled on solid support using peptide synthesis techniques to first create a flexible oligomer that is then rigidified by the simultaneous formation of a second set of amide bonds between each adjacent pair of monomers. The structure of the resulting spiro-linked oligomers is controlled by the sequence and stereochemistry of the component monomers.

The oligomer structures made accessible by this technology range from extended molecular rods to compact structures containing small-molecule sized cavities. See Christian E. Schafmeister, Stephen A. Habay, Christopher G. Levins, Paul M. Morgan, Sharad Gupta, and Gregory H. Bird, "A Synthetic Approach to Water Soluble Nanoscale Molecules with Controlled Structures," Abstract for the 1st Conference on Advanced Nanotechnology; Christian E. Schafmeister, *Org. Lett.*, 8:2807-10 (2006); Christian E. Schafmeister, *J. Org. Chem.*, 70:9002-8 (2005); Christian E. Schafmeister, *Org. Lett.*, 7:2861-4 (2005); and Christian E. Schafmeister, *J. Am. Chem. Soc.*, 125:4702-3 (2003).

In general, a peptide (amino acid oligomer) is a polymer in which the monomers are amino acids, a group of molecules which includes natural or unnatural amino acids, amino acid mimetics, and amino acid derivatives, which are generally joined together through amide (peptide) bonds. A peptide can alternatively be referred to as a polypeptide. Peptides contain two or more amino acid monomers, and often more than 50 amino acid monomers (building blocks).

Figure 6:
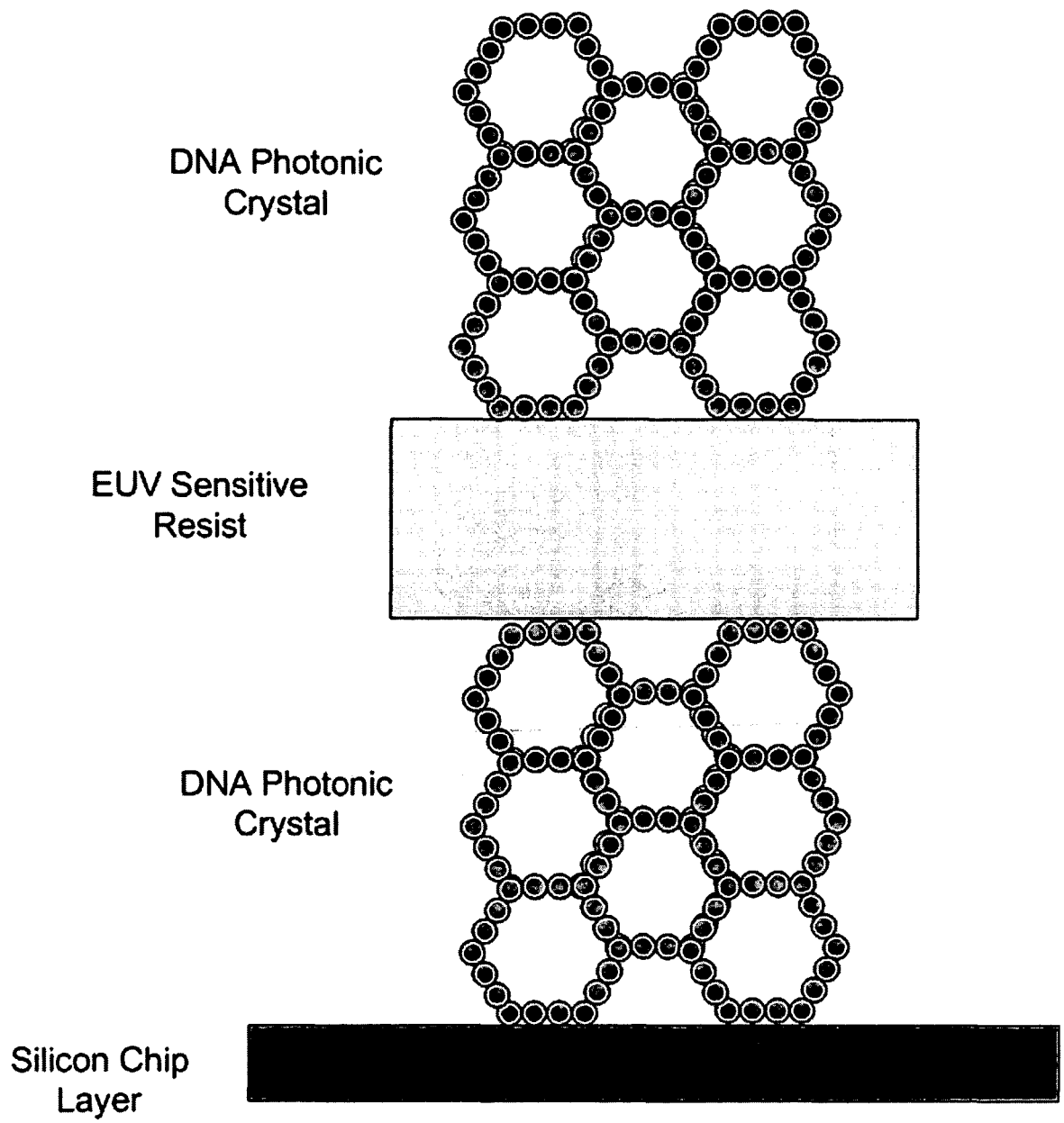
FIG. 6 shows an exemplary EUV photoresist composition created using DNA photonic crystals.

A molecular photonic crystal with a stop band (band gap) in the EUV region is created and the defects in this lattice are used to create to create high-Q resonators. Defects can be created by changing the spacing of the cells inside the photonic crystal. A change in spacing changes the frequency of light that is blocked by the crystal and allows formerly blocked radiation to propagate. Thus a layered approach can be used to create a high photosensitivity resist. For example, the photoresist can consist of two layers or three layers. The layered photoresist consists of top and/or bottom layers of DNA or peptide photonic crystals that have periodic holes and Bragg reflect EUV radiation. An additional layer that is not a photonic crystal material but instead consists of monomer blocks of either a polymer, or tiles of DNA/peptides bonded together with cross-linking groups and radiation activated acid-generating molecules (PGAs) additives. The layered motif can consist of a top or a bottom layer of photonic crystal and a photoresist layer, as shown, for example in FIG. 6. In FIG. 6 the DNA segments lay parallel to the surface of the chip. The three layered motif consists of a bottom and a top layer of photonic crystal and a middle layer of photoresist. The layer structure allows lithographic patterning of a surface, such as a semiconductor silicon wafer surface. The lithographic patterning is not limited to a particular technique, and typical methods as used in the semiconductor industry are contemplated. The photoresist can then be stripped from areas that have been exposed to radiation in a pattern as determined by the lithography and further wafer processing can occur.

Figure 7:
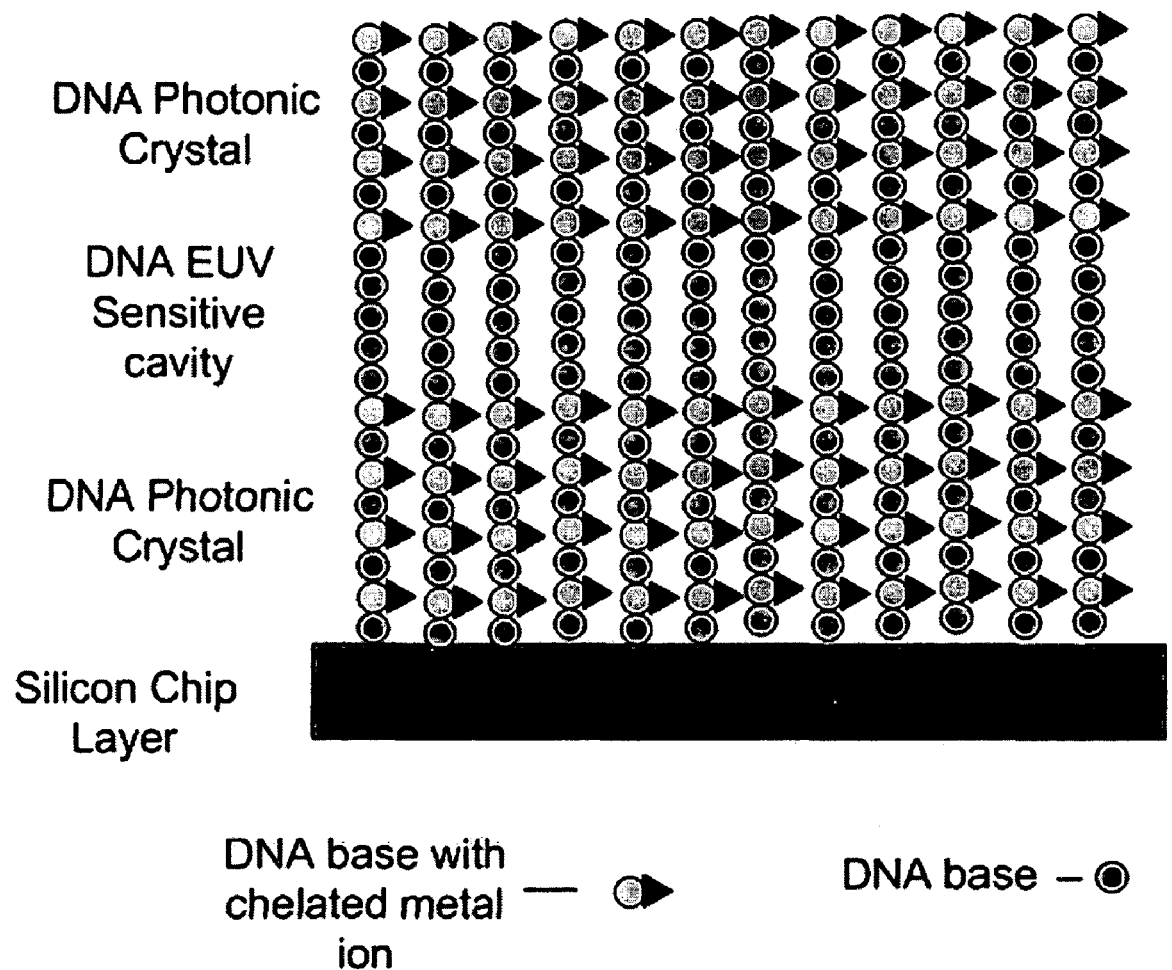
FIG. 7 shows an exemplary EUV photoresist composition created using a DNA-metal chelating photonic crystal.

FIG. 7 provides a further exemplary embodiment in which the photonic crystal of a layered photoresist structure is created from a DNA metal chelating photonic crystal. The DNA metal chelating base is, for example, a deoxycytidine analogue phosphoramide that chelates metals. See, for example, Cesare Giorano, et al., "Synthesis of metal-chelating deoxycytidine-analogue," *Thieme*, (2004). The chelated metal ion scatters EUV radiation through its deep electron orbitals. In FIG. 7, the photoresist is created from a layer of DNA photonic crystal, a central layer of DNA EUV sensitive cavity, and a third layer of DNA photonic crystal.

Compounds that are capable of providing acid upon photo exposure are termed photgenerated acids (PGAs). In general, PGAs useful in the present invention include for example, acids can be generated photochemically from sulfonium salts, halonium salts, and polonium salts. Sulfonium ions are positive ions, $R_3S^+$, where R is, for example, a hydrogen or alkyl group, such as methyl, phenyl, or other aryl group.

Halonium salts include, for example, trimethyl sulfonium iodide and triaryl sulfonium hexafluroantimonatate (TASSbF$_6$). In general, halonium ions are bivalent halogens, R$_2$X$^+$, where R is a hydrogen or an alkyl group, such as methyl, phenyl, or other aryl group, and X is a halogen atom. The halonium ion may be linear or cyclic. Polonium salt refers to a halonium salt where the halogen is iodine, the compound R$_2$I$^+$Y$^-$, where Y is an anion, for example, a nitrate, chloride, or bromide. Polonium salts include, for example, diphenyliodonium chloride and diphenyliodonium nitrate. See also, Frechet, J. M. J., Ito, H., Willson, C. G., *Proc. Microcircuit Eng.*, 260, (1982); Shirai, M., Tsunooka, M., *Prog. Polym. Sci.*, 21:1, (1996); Frechet, J. M. J., Eichler, E, Ito, H., Willson, C. G., *Polymer*, 24:995, (1983); and Frechet, J. M. J., Ito, H., Willson, C. G., Tessier, T. G., Houlihan, F. M. J., *J. of Electrochem. Soc.*, 133:181 (1986).

In general, embodiments of the present invention are not dependent upon the type of photoresist chosen. Photoresist formulations useful in the present invention include a polymer, a solvent, and a radiation-activated acid-generating reagent (PGA). Useful polymers include, for example, poly (methyl methacrylate) (PMMA), poly-(methyl isopropenyl ketone) (PMPIK), poly-(butene-1-sulfone) (PBS), poly-(trifluoroethyl chloroacrylate) (TFECA), copolymer-(α-cyano ethyl acrylate-α-amido ethyl acrylate (COP), and poly-(2-methyl pentene-1-sulfone). Useful solvents include, for example, propylene glycol methyl ether acetate (PGMEA), ethyl lactate, and ethoxyethyl acetate. The solvent used in fabricating the photoresist may be selected depending on the particular polymer, photosensitizer, and photo-active compound that are selected. For example, when the polymer used in the photoresist is PMMA, the photosensitizer is isopropylthioxanthenone, and the photoactive compound is diphenyliodonium chloride, PGMEA or ethyl lactate may be used as the solvent.

By adjusting the thickness of the bottom and top photonic crystal layers a leaky resonator can be created that will enhance the local radiation field induced by the incident radiation; i.e., with a highly reflective bottom layer and a semi-transparent top layer we gain a large standing wave in the PGA-populated volume. In one example, the thickness can be adjusted by varying the length of the DNA strands that make up the rods which build the photonic cavities.

Photonic crystals can be assembled on the wafer surface through self-assembly techniques used to create monolayers. For example, the wafer can be dipped in a solution containing crystalline subunits, or by spinning a layer of solution containing the crystal subunits and drying the solution. As the solution dries the crystal assembles on the surface.

In a further embodiment, EUV mirrors are created. In this embodiment photonic crystals comprised of self-assembling DNA or peptides, are assembled on a substrate surface. As above, a photonic crystal gap can be can be created in the regions surrounding and between the 10 to 15 nm wavelength useful in EUV lithography by, for example, adjusting the number of helices in a DNA motif. The photonic band gap determines the wavelength of light reflected by the mirror. In further embodiments multiple layers of photonic crystals are applied to a substrate surface. If the multiple layers possess different abilities to block and transmit EUV radiation, precise control over the wavelengths of radiation reflected can be obtained. Further, photonic crystals having defects may be used. In this case, light of a specific wavelength will be transmitted. A substrate that is also capable of transmitting EUV radiation may also be supplied and a mirror capable of transmitting light within defined wavelengths created.

In an additional embodiment, DNA/peptide motifs or blocks are used as the body of the photoresist in order to control line roughness. A motif is a set of molecular parts that can be assembled into bigger units. In the present example, covalent bonds are used to hold the sub-blocks together, such as for example, disulfide bonds that are created after the peptide structures form into a desired motif. Here the sub-nanometer scale definition of the motif defines fine "fracture" lines that have straight edges due to the covalent bonding of the motif. If the motif is rectangular, long straight lines can be photo-exposed. If the motif is some other shape then the line edge will undulate with the characteristic shape of the motif. For example, long peptide strands that have side groups capable of creating photonic crystal regions and resonant cavities and additional side groups that can cross-link to preserve the motif structure. The peptides are oriented as long strands perpendicular to the substrate. PGAs can be made part of these motifs to guarantee a highly uniform photosensitivity distribution. A final attribute of using such motifs is that the regular array can be aligned to sub-nanometer registration by the use of registration walls on either side of a region. This has been shown in block co-polymer systems where very rigidly defined lines with typically the spacing of the monomers widths form up inside the system aligning with the constraining walls. See Matthew Trawick, Christopher Harrison, P. M. Chaikin, John Sebastian, Richard A. Register, Douglas H. Adamson, Zhengdong Cheng, Miri Park, "Alignment of Block Copolymer Spherical Microdomains Using Substrate Features," APS March 2001 Meeting Abstracts; and "Materials Science: On the Straight and Narrow," *Nature*, 424, 378-379 (2003). Thus, according to embodiments of the invention, nanometer definition photoresists with nanometer registration can be created.

What is claimed is:

1. A method for creating a photoresist composition comprising:
    providing a substrate surface;
    applying a coating consisting of DNA polymers capable of self-assembling into a photonic crystal;
    allowing the DNA polymers to form a crystalline structure; and
    applying a coating consisting of photoresist polymer and a compound capable of generating an acid upon exposure to radiation on top of the DNA polymer coating layer.

2. The method according to claim 1 wherein the band gap of a resulting photonic crystal is between 10 and 15 nm.

3. The method according to claim 1 wherein DNA polymers capable of self-assembling into a photonic crystal are DNA nanotubes.

4. A method for lithographically patterning comprising those elements as recited in claim 1 and further comprising lithographically patterning the substrate surface.

5. The method according to claim 4 also comprising removing photoresist in areas that have been patterned.

6. The method according to claim 1 wherein the compound capable of generating an acid upon exposure to radiation is selected from the group consisting of sulfonium salts, halonium salts, and polonium salts.

7. A method for creating a photoresist composition comprising:
    providing a substrate surface;
    applying a coating consisting of DNA polymers capable of self-assembling into a photonic crystal;
    allowing the DNA polymers to form a crystalline structure;
    applying a coating consisting of photoresist polymer and a compound capable of generating an acid upon exposure to radiation on top of the DNA polymer coating layer;

applying a second coating consisting of DNA polymers capable of self-assembling into a photonic crystal; and allowing the DNA polymers of the second coating to form a crystalline structure.

8. The method according to claim 7 wherein the band gap of a resulting photonic crystal is between 10 and 15 nm.

9. The method according to claim 7 wherein DNA polymers capable of self-assembling into a photonic crystal are DNA nanotubes.

10. A method for lithographically patterning comprising those elements as recited in claim 7 and further comprising lithographically patterning the substrate surface.

11. The method according to claim 10 also comprising removing photoresist in areas that have been patterned.

12. The method according to claim 7 wherein the compound capable of generating an acid upon exposure to radiation is selected from the group consisting of sulfonium salts, halonium salts, and polonium salts.

13. A method for creating a photoresist composition comprising:

providing a substrate surface;

applying a coating comprising spiro-linked amino acid oligomers capable of self-assembling into a photonic crystal to the substrate surface;

allowing the spiro-linked amino acid oligomers to form a crystalline structure; and applying a coating consisting of photoresist polymer and a compound capable of generating an acid upon exposure to radiation to the substrate surface.

14. A method for lithographically patterning comprising those elements as recited in claim 13 and further comprising.

* * * * *